United States Patent
Zanchi

(10) Patent No.: US 7,113,039 B2
(45) Date of Patent: Sep. 26, 2006

(54) GAIN-BOOSTED OPAMP WITH CAPACITOR BRIDGE CONNECTION

(75) Inventor: Alfio Zanchi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 10/911,210

(22) Filed: Aug. 4, 2004

(65) Prior Publication Data

US 2006/0028273 A1 Feb. 9, 2006

(51) Int. Cl.
*H03F 3/45* (2006.01)
*H03F 1/22* (2006.01)
(52) U.S. Cl. .................................. 330/252; 330/311
(58) Field of Classification Search ........... 330/260
See application file for complete search history.

(56) References Cited

U.S. PATENT DOCUMENTS 6,114,907 A * 9/2000 Sakurai .................. 330/253

6,956,434 B1 * 10/2005 Gupta ..................... 330/253

* cited by examiner

Primary Examiner—Robert Pascal
Assistant Examiner—Alan Wong
(74) Attorney, Agent, or Firm—Warren L. Franz; W. James Brady, III; Frederick J. Telecky, Jr.

(57) ABSTRACT

The number of compensation capacitors of an opamp may be reduced by connecting the compensation/decoupling capacitor element or elements between the load node and the bias node of the operational amplifier, rather than providing separate capacitive elements from each load node to ground (the reference voltage). This allows one to both reduce the overall area occupancy of the operational amplifier, and/or to improve the settling characteristics of its common-mode and differential output signal. The opamp may be part of a multi-stage amplifier or an analog-to-digital converter (ADC) (e.g., a pipelined ADC), which may form part of a multi-stage wireless communications base station receiver.

34 Claims, 7 Drawing Sheets

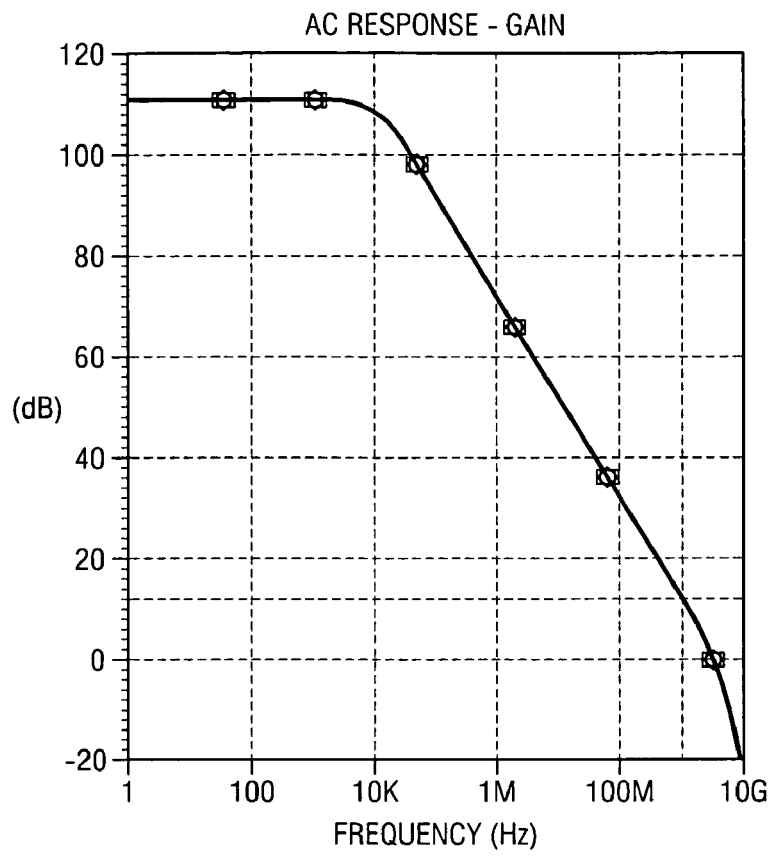
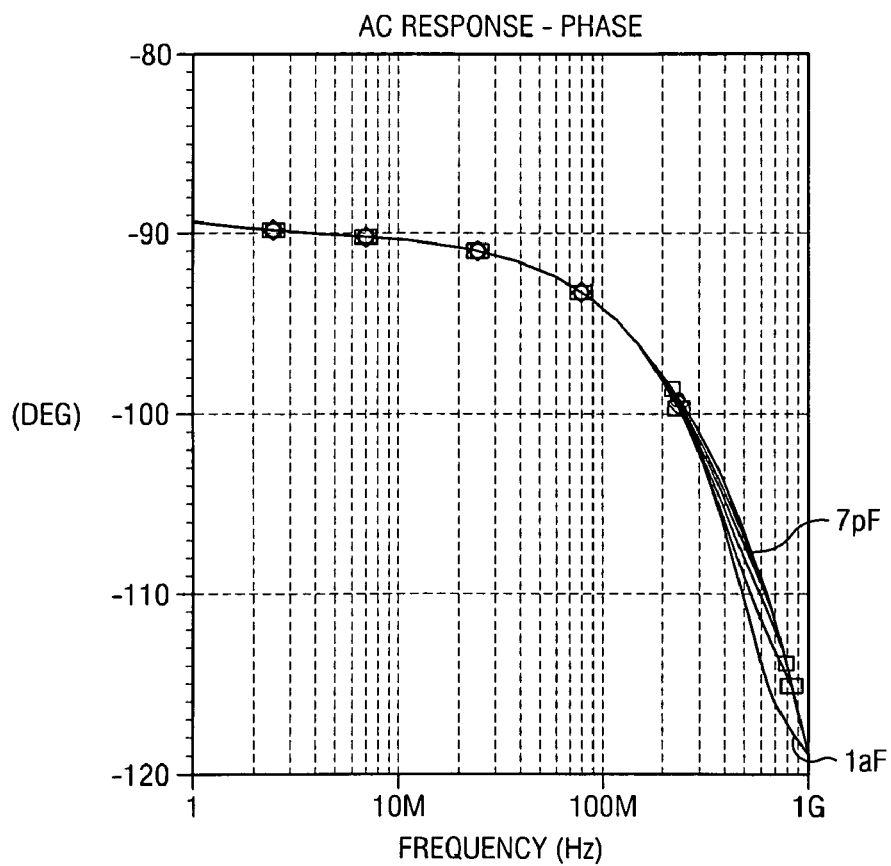
FIG. 3

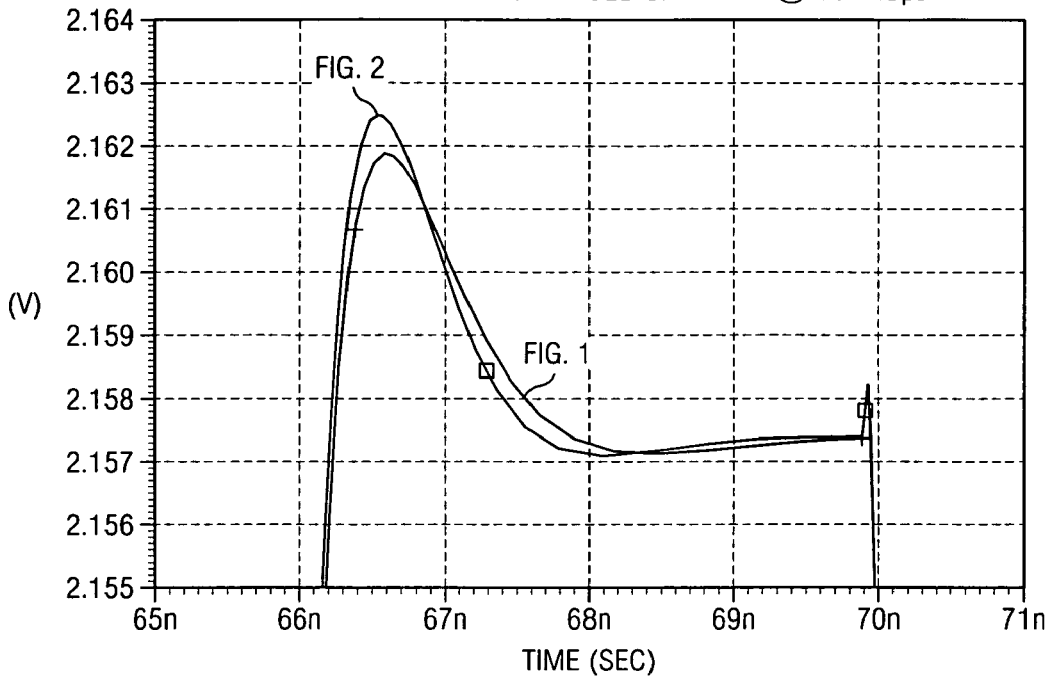
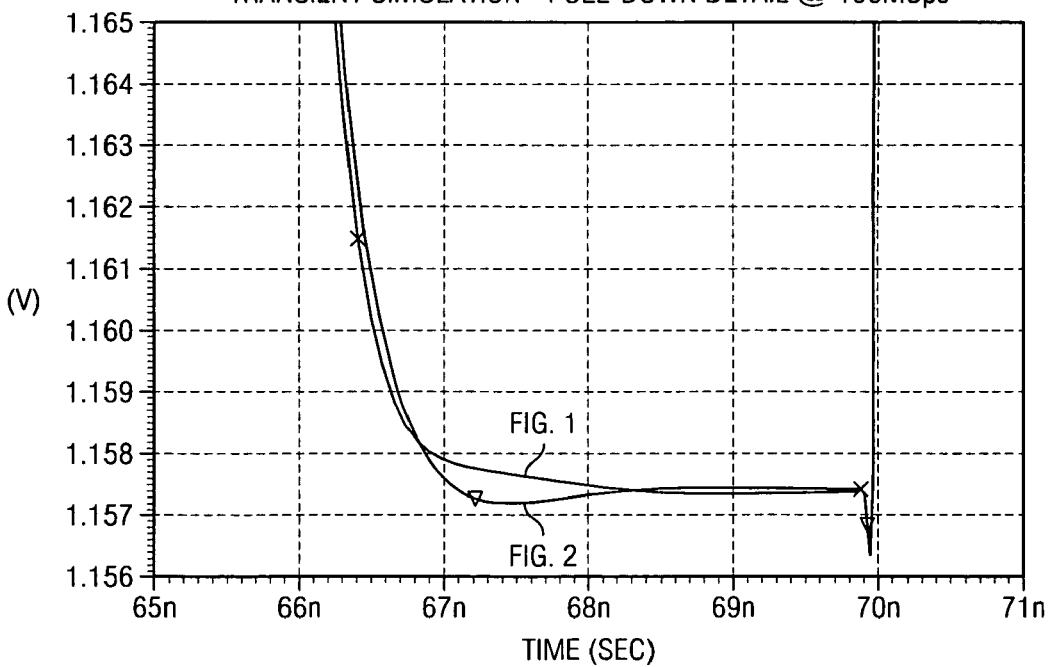

GAIN-BOOSTED OPAMP WITH CAPACITOR BRIDGE CONNECTION

CROSS REFERENCE TO RELATED APPLICATIONS

N/A

STATEMANT REGARDING FEDERALLY SPONSORED RESEARCH OR DEVELOPMENT

N/A

BACKGROUND OF THE INVENTION

The present invention in some aspects relates to gain-boosted operational amplifiers (opamps). In other aspects, the invention relates to opamps for pipelined analog-to-digital converters (ADCs).

Operational amplifiers are employed in many different types of devices. For example, wireless communications systems have base station receiver chains that employ analog-to-digital converters (ADCs), and each ADC may employ opamps. The pipelined ADC architecture is employed to build high speed and high resolution ADCs, each having an analog core which employs high gain, high frequency opamps.

Pipelined ADCs have become a de facto standard in base station receiver chains for wireless communication systems. The pipelined ADC has a fast architecture, and is believed to provide a fair compromise among resolution, power consumption, and conversion speed.

In certain contexts, such as in base station receiver chains implemented in a miniaturized integrated circuit (IC) (such as an SOC (system on a chip)), there is a desire to scale down the voltage supply of the pipelined ADC.

Pipelined ADCs and their components, particularly the opamps they employ, continue to evolve. Efforts are underway to reduce the voltage supply level required for the pipelined ADC to levels at 3.3V and below, to allow further miniaturization of the integrated circuit (IC) and to lead to inclusion of such devices in an SOC (system on a chip). Meanwhile, the gain levels for these pipelined ADCs are beyond 80 dB for ADC resolutions of 12 or more bits per word, while the intrinsic gain for a given transistor may be well below 30 dB. Add to these constraints the continued necessity that these circuits operate well at high speeds.

Various pipelined ADCs have been designed to attain higher gains and speeds. To this end, various improved opamp structures are being introduced, including one-stage telescopic amplifiers, opamps with a single stage preceded by low-gain preamplifiers, or two-stage opamp architectures. In each of these opamp structures, some form of cascoding is adopted on the main gain stage, to make up for a reduced output impedance of the transistors (i.e. reduced Early voltage). This approach also takes advantage of the better transconductance ($g_m$) of short-channel transistors.

The following references describe examples of opamp structures generally taking this approach.

[1] A. Loloee, A. Zanchi, H. Jin, S. Shehata, and E. Bartolome, "A 12 b 80 MSps Pipelined ADC Core With 190 mW Consumption from 3V in 0.18 μm Digital CMOS", in *Proceedings of the IEEE European Solid-State Circuits Conference (ESSCIRC)* 2002, Florence (Italy), Sep. 24–26, 2002, pp. 467–470.

[2] B. M. Min, P. Kim, D. Boisvert, and A. Aude, "A 69 mW 10 b 80 MS/s Pipelined CMOS ADC ", *IEEE ISSCC Digest of Technical Papers*, San Francisco, Calif., February 2003, pp. 324–325.

[3] A. R. Bugeja and S. U. Kwak, "Design of a 14 b 100 MS/s Switched-capacitor Pipelined ADC in RFSiGe BiCMOS", in *Proceedings of the ISCAS* 2001, Sydney, Australia, May 2001, pp. 428–431.

[4] L. Singer, S. Ho, M. Timko, and D. Kelly, "A 12 bit 65 Msample/s CMOS ADC with 82 dB SFDR at 120 MHz", in *ISSCC Digest of Technical Papers*, San Francisco, Calif., February 2000, pp. 38–39.

[5] A. Zanchi, F. Tsay, and I. Papantonopoulos, "Impact of Capacitor Dielectric Relaxation on a 14-bit, 70-MSps Pipeline ADC in 3-V BiCMOS", in press for *IEEE Journal of Solid-State Circuits*, December 2003.

[6] D. Kelly, W. Yang, I. Mehr, M. Sayuk, and L. Singer, "A 3V 340 mW 14 b 75 MSps CMOS ADC with 85 dB SFDR at Nyquist", in *ISSCC Digest of Technical Papers*, San Francisco, Calif., February 2001, pp. 134–135.

Existing opamp structures, such as those identified above, may not sufficiently boost their gain, with a requisite level of performance. Accordingly, other techniques may be employed to facilitate gain-boosting, including using an auxiliary amplifier to reinforce the output impedance of the principal transconductance amplifier. This is discussed, for example, by Bult et al., "A Fast-settling CMOS Opamp for SC Circuits With 90-dB DC Gain", *IEEE Journal of Solid-State Circuits*, Vol. 25, December 1990, pp. 1379–1384.

Popular circuits which provide a gain-boosting function include a single-ended common-source stage as disclosed by Bugeja et al. (see citation above), or a form of differential folded-cascode servo-amp, as disclosed by Loloee et al. (citation above), or Min et al. (citation above).

These solutions generally share a common problem of pole-zero doublet compression. Apfel et al., "A Fast-settling Monolithic Operational Amplifier Using Doublet Compression Techniques", IEEE Journal of Solid-State Circuits, Vol. 9, No. 6, December 1974, pp. 332–340.

Doublet compression can be relieved by placing a capacitor (otherwise referred to as a compensation capacitor) within the loop of the booster to limit its bandwidth of response. This prevents the doublet from approaching the second pole of the main opamp, and moves the pole and zero closer to each other in absolute terms. The result is that the opamp AC response has a smoother phase profile.

Opamp structures will typically also "ballast" the internal voltage reference nodes generated by the bias network of the opamp (often a series of diodes) with a localized capacitor. This is done to filter out voltage spikes propagating from the power supply, and to limit the high frequency noise as much as possible.

FIG. 1 is a schematic of a background amplification circuit, improved upon by employing circuits later illustrated in FIGS. 2 and 3. The illustrated circuit comprises a one stage BiCMOS opamp. The illustrated opamp 10 comprises bias circuitry 12 and an output stage 14. The illustrated output stage 14 comprises transductance elements 16, corresponding cascode elements 18, current source elements (active load) 20, corresponding cascode elements of the load 26, and gain boosters 24.

Current source elements 20 are connected to corresponding current source cascode elements 26, which are in turn connected to transconductance elements 16 via respective corresponding cascode elements 18. Tail elements 22 are provided between transconductance elements 16 and a reference voltage node AVSS, which is zero volts in the illustrated embodiment. Current source elements 20 are coupled to a DC power supply AVDD, which in the illustrated embodiment is 3.3V.

In the illustrated amplification circuit 10, bias circuitry 12 comprises a bias node 13 connected to the base of each of corresponding cascode elements 18, which correspond to transconductance elements 16. Cascode elements 18 and their corresponding transductance elements 16 form part of output stage 14. Bias circuitry 12 further comprises a current source 28 and a set of interconnected diode elements. In the simplified circuit illustrated, those diode elements are n type and p type transistor elements, specifically comprising PMOS field effect transistors (FETs) T1 and T2, an npn bipolar junction transistor (BJT) T11, and NMOS field effect transistor (FETs) T14, T17, and T18.

Transconductance elements 16 comprise npn BJTs T15 and T16. Tail elements 22 comprise NMOS FETs T19 and T20. Corresponding cascode elements 18 comprise npn BJTs T12 and T13. Current source elements 20 comprise PMOS FETs T3 and T4. Corresponding source cascode elements 26 comprise PMOS FETs T5 and T8.

The illustrated amplification circuit 10 serves as a differential amplifier with differential inputs, the amplification of which is represented across the differential outputs. In the illustrated embodiment, the differential inputs comprise $IN_p$ ($V_{in-p}$) and $IN_n$ ($V_{in-n}$), which comprise the respective bases of transconductance elements 16. The illustrated circuit further comprises outputs $OUT_n$ ($V_{out-n}$) and $OUT_p$ ($V_{out-p}$), located at which points between the drains of corresponding current source cascode elements 26 and the collectors of cascode elements 18.

The illustrated circuit 10 further comprises gain boosters 24. Each booster 24 is connected between a sense node 29 at its input, to read the intermediate voltage between load 20 and respective cascode element 26; and a driven node 25 at its output, to control the node's voltage level forming a feedback loop around the cascode element 26, which increases its output impedance. The boosters 24 are supplied by the same voltages AVDD and AVSS as the whole opamp, whereby AVDD is 3.3V and AVSS is 0V in the illustrated embodiment. Boosters 24 are respectively connected to outputs $OUT_n$ and $OUT_p$ via the corresponding current source cascode elements 26. Gain boosters 24 serve to increase the impedance across the output of the circuit, thereby increasing the amplification of the voltage signal between the input terminals and the output terminals. Specifically, the gain is equal to $[(V_{out-p})-(V_{out-n})]/[(V_{in-p}-V_{in-n})]$. The illustrated circuit 10 comprises a set of circuit elements that form a P-block, meaning that the elements contained within that portion of output stage 14 are generally P type elements (PMOS FETs, pnp BJTs). Another set of elements form an N-block meaning that those elements are generally N type elements (NMOS FETs, npn BJTs).

In the illustrated circuit, the active loads implemented in the P-block comprise respective gain booster portions 24. In the circuit of FIG. 1, gain booster portions 24 comprise two single-ended servo-opamps.

FIG. 3 presents AC response plots for the operational amplifier shown in FIG. 1. Specifically, the smoothness of the phase plot of the amplifier (and consequently its phase margin) can be improved by increasing the capacitances value of the compensation capacitor 30 within the one stage operational amplifier shown in FIG. 1. This is confirmed by the waveforms shown in FIG. 3, which illustrates the gain AC response and the phase AC response of the noted circuit, for different compensation capacitor values ranging from as high as 7 picofarads to as low as 1 attofarads (lowest curve in the phase plot). The higher compensation capacitor value of 7 picofarads results in the better waveform AC responses, particularly a better phase response. It is beneficial to increase the amount of capacitance of the compensation capacitor. Specifically, by increasing the amount of capacitance, the long-term voltage ringing at the output of the differential amplifier can be zeroed out. Analogously, increasing the amount of capacitance of the capacitor decoupling the bias node 13 toward a steady voltage (AVSS in the illustrated embodiment) enhances the common-mode stability of the amplifier 10.

BRIEF SUMMARY OF THE INVENTION

The number of compensation capacitors of an opamp may be reduced by connecting the compensation capacitor element or elements between the booster driven node 25 and the bias node 13 of the operational amplifier, rather than providing separate capacitive elements from each load node to ground (or toward a steady reference voltage). This allows one to either halve the capacitor values, reducing the overall area occupancy of the opamp 10 and yet improving the settling characteristics of the common-mode and differential output signal of the opamp; or maintain the same area occupancy, while effectively doubling the amount of capacitance seen by both the booster-driven and the bias nodes, and improving the common-mode and differential response of the opamp to an even higher extent. The opamp may be part of a multi-stage amplifier or an analog-to-digital converter (ADC) (e.g., a pipelined ADC), which may form part of a multi-stage wireless communications base station receiver.

Other features, functions and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 3 shows gain and phase waveforms representing the OUTp-OUTn differential output AC response of the circuit illustrated in FIG. 1;

FIG. 6 shows waveforms of the positive transient responses of the circuits in FIGS. 1 and 2;

FIG. 7 shows waveforms of the negative transient responses of the circuits in FIGS. 1 and 2;

DETAILED DESCRIPTION OF THE INVENTION

One embodiment of the invention is directed to an operational amplifier opamp. In another embodiment, the invention is directed to a multi-stage amplifier, or to a given stage of a multi-stage amplifier for an analog-to-digital converter (ADC). More specifically, the invention may be directed to a multi-stage wireless communications base station receiver comprising such a pipelined ADC.

The opamp comprises bias circuitry and an output stage. The bias circuitry comprises a bias node, and provides at the bias node a given DC bias voltage. The output stage comprises a transconductance element or a differential pair of transconductance elements. For each transconductance element, a corresponding cascode element may be provided. The transconductance elements and the cascode elements may be transistors, either n-type or p-type. An n-type transistor may comprise an npn BJT or an NMOS FET. A p-type transistor may comprise a pnp BJT or a PMOS FET.

Each cascode element corresponding to a respective transconductance element has a connection to the bias node. Each cascode element may be a transistor having a control input (a base or a gate), a current input (an emitter or a source), and a current output (a collector or a drain). A DC cascode voltage from the DC bias voltage (or equal to the DC bias voltage) is maintained at the control input of the cascode element.

The amplification circuit may be further provided with a load for each transconductance element. The load may be an active load. In a particular embodiment, the load may comprise a gain booster. More specifically, the booster within the load may comprise two single ended opamps. Alternatively, the booster within the load may comprise a single differential opamp. The booster may be connected between a sense node having a given voltage level and a given driven node controlling the voltage level of a base or a gate of a cascode element. The current source elements may provide a given current (a collector current or a drain current) first through the corresponding cascode elements, and then through the proper transconductance elements. The current source elements may in turn comprise current source cascode elements.

A capacitive element (a capacitor in the illustrated embodiments) is connected between the load node and the bias node. A set of capacitive elements may be provided, the set comprising at least one capacitive element connected between the booster-driven node of each load portion and the bias node.

Figure 1:
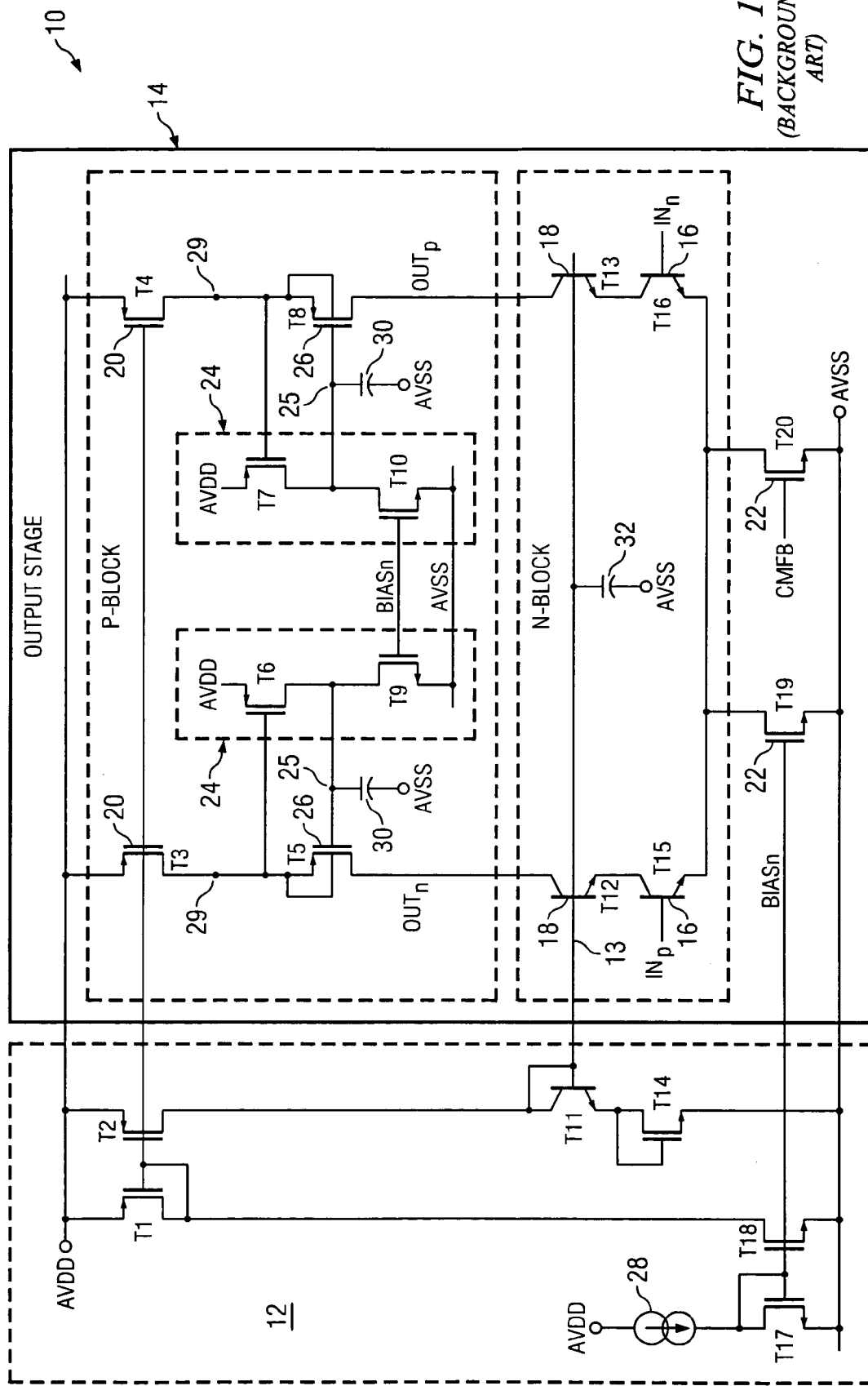
FIG. 1 is a detailed schematic diagram of a one stage BiCMOS opamp.
Figure 2:
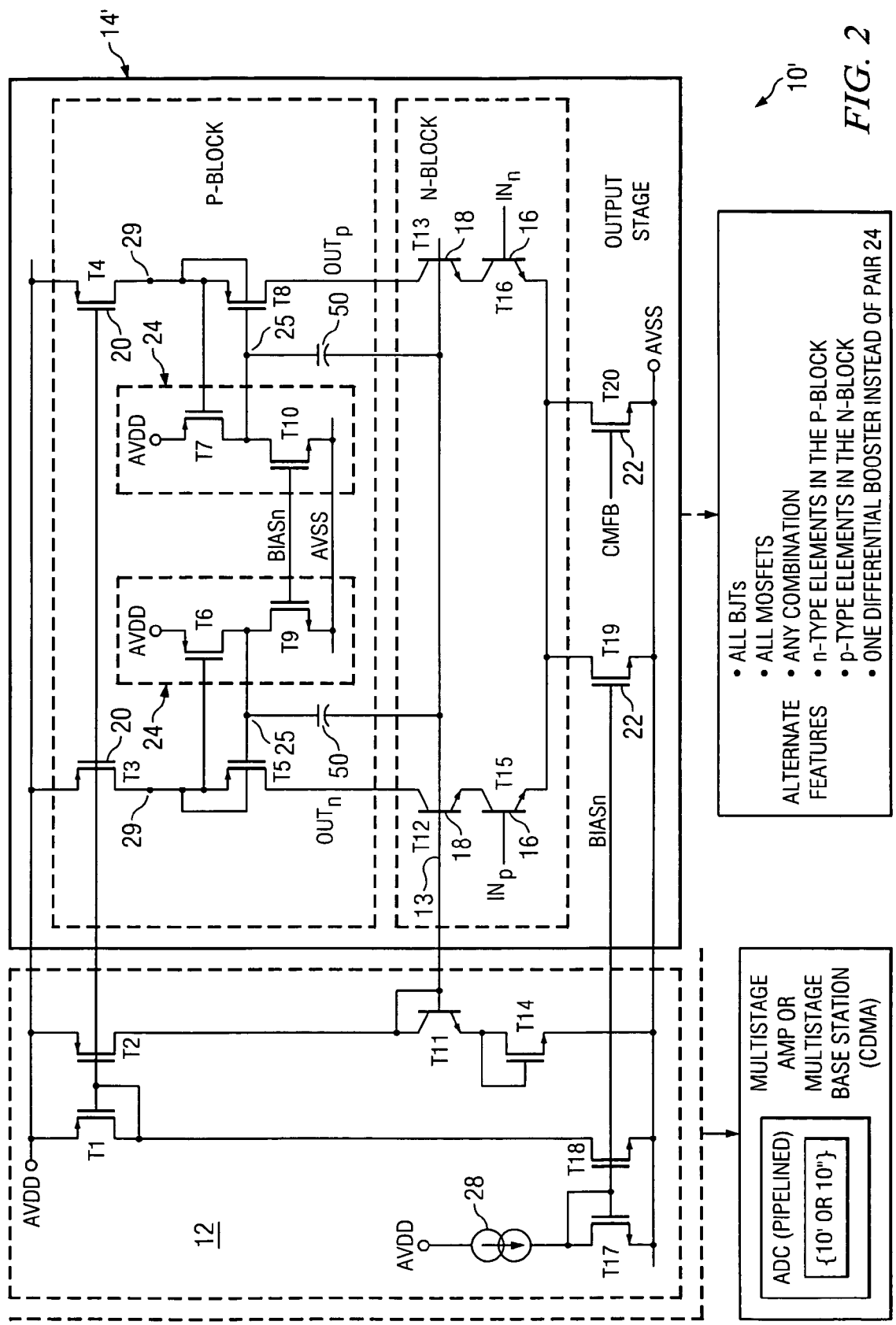
FIG. 2 is a schematic diagram of a multi-stage amplifier/base station with an improved one stage BiCMOS opamp.

FIG. 2 is a schematic diagram of a multistage amplifier/ wireless communications base station, comprising, among other elements, an ADC (pipelined ADC in the illustrated embodiment). The ADC comprises a one stage BiCMOS opamp 10'. This opamp 10' is similar to the opamp 10 shown in FIG. 1 with the exception of certain modifications. Specifically, the circuit shown in FIG. 2 is identical to the circuit shown in FIG. 1, except for the following elements.

Opamp 10' comprises an output stage 14 which does not have compensation and decoupling capacitors connected to ground, such as compensation capacitors 30 and decoupling capacitors 32 in the circuit illustrated in FIG. 1. Rather, opamp 10' has a pair of compensation capacitors 50 connected between the booster driven node 25 and the bias node 13. Specifically, in the illustrated circuit, a compensation capacitor 50 is connected between node 25 for the N-side active load driven by gain booster 24, and another compensation capacitor 50 is connected between node 25 for the P-side active load and the same bias node 13. Each compensation capacitor 50 is connected between a gate of a corresponding current source cascode element T5 or T8 and bias node 13.

FIG. 3 shows waveforms based upon simulation of the circuit of FIG. 1, to illustrate the AC response of that circuit in terms of the amplitude (left) and phase (right) of the output differential voltage OUTp–OUTn. The simulation was performed by changing the value of the compensation capacitors 30 in FIG. 1 from 7 pF down to 1 aF, setting the output common mode at mid-rail voltage (3.3V supply/ 2=1.65V) and shows the impact of the pole-zero doublet introduced by the gain boosters 24, well visible on the phase plot. The phase plot indicates a significant degradation of the phase margin for small values of the compensation capacitors, whereas from about 3 pF up the plot profiles are almost superimposed to each other and follow a standard second-pole phase decay.

Figure 4:
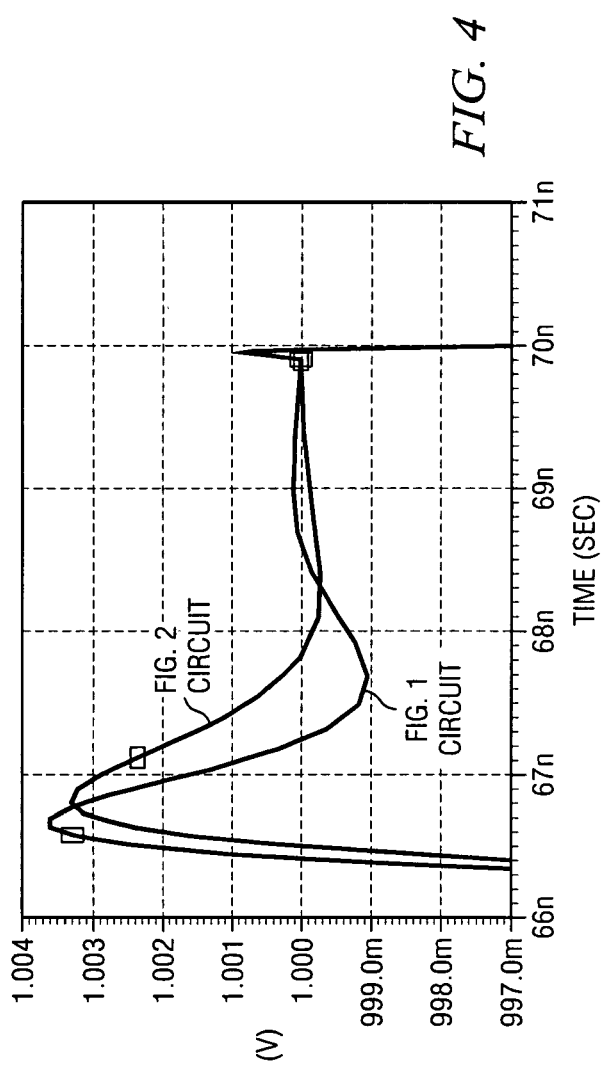
FIG. 4 shows waveforms representing the transient responses for the circuits shown in FIGS. 1 and 2, measured in terms of the voltage difference OUTp-OUTn.

FIG. 4 shows waveforms representing the transient responses of the circuits in FIGS. 1 and 2, in terms of the differential voltage OUTp-OUTn. The compensation capacitors 30 of FIG. 1 each have values of 4.5/2 (equal to 2.25) pF, and the decoupling capacitor 32 has a value of 4.5 pF. Opamp 10' of FIG. 2 includes instead two compensation capacitors 50 each having a value of 4.5 pF, hence occupying the same area as the three capacitors in FIG. 1. The opamps of FIGS. 1 and 2 were each placed in a switched-capacitor loop with a closed-loop gain of 4, and stressed to the maximum of their output ranges for an output 2 volt peak-to-peak differential (2Vpp). As illustrated in FIG. 4, the output provided by the opamp incorporating the invention is sensibly less prone to ringing.

Figure 5A:
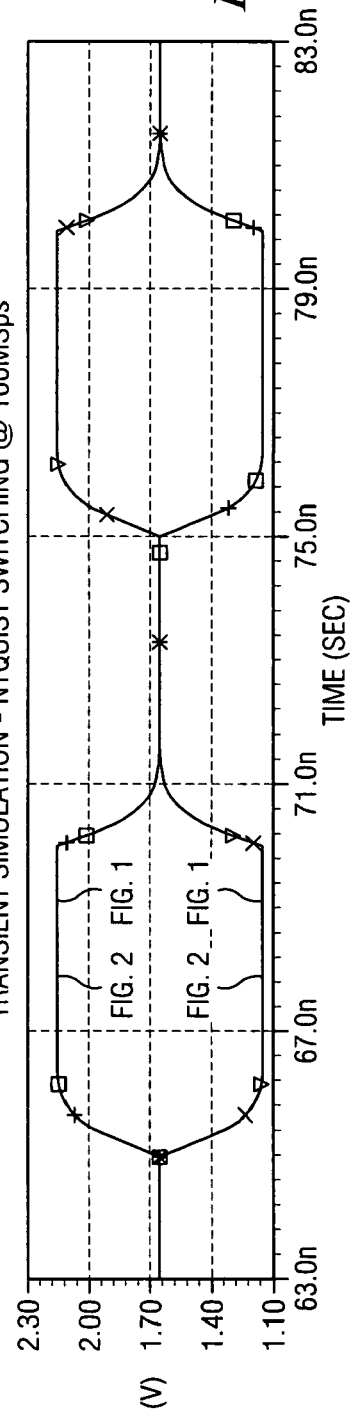
FIG. 5 shows waveforms (a) (b) and (c): waveforms (a) representing the transient voltage outputs at OUTn and OUTp for the circuits in FIGS. 1 and 2; waveforms (b) representing for the same circuits the transient voltage at the driven nodes 25 corresponding to the respective outputs OUTn and OUTp; and waveforms (c) representing for the same circuits the bias voltage at the bias node 13.
Figure 5B:
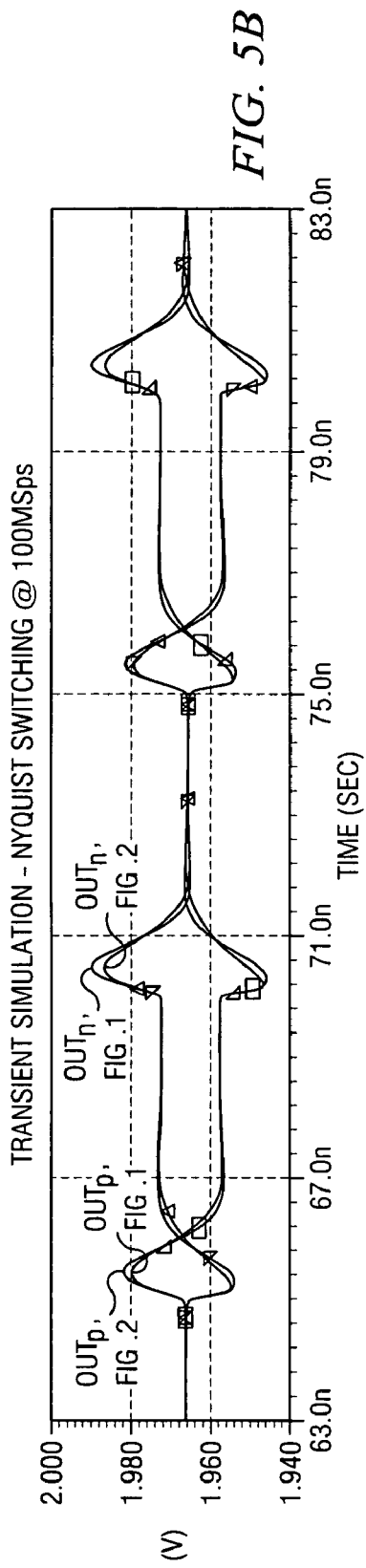
Figure 5C:
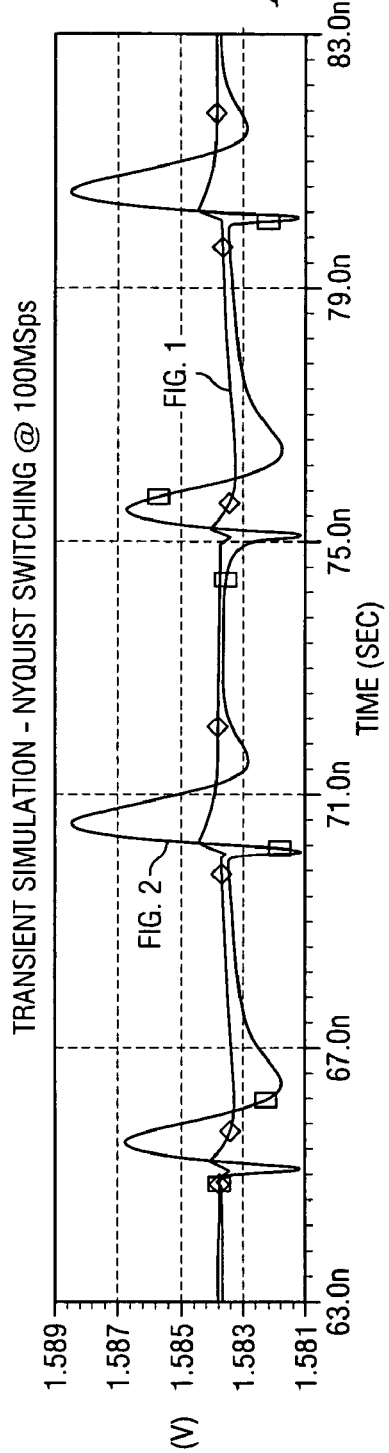

FIG. 5 shows waveforms (a), (b) and (c). Waveforms in (a) represent the single-ended transient voltage output at OUTn and OUTp for the circuits in FIGS. 1 and 2. Waveforms (b) represent for the same circuits the transient voltage out the booster-driven nodes 25 corresponding to the respective outputs OUTn and OUTp. Waveforms (c) represent for the same circuits the bias voltage at the bias node 13.

For each of the waveforms in FIG. 5, the circuits of FIGS. 1 and 2 were simulated, with the following capacitor values for each of the compensation or decoupling capacitors in those figures.

For the circuit in FIG. 1, capacitors 30 were each set at 4.5 pF, and capacitor 32 was set at 9 pF. The capacitors 50 on the circuit in FIG. 2 were set at 4.5 pF each, hence with 50% area saving when compared to the circuit of FIG. 1. Each of the opamp circuits of FIGS. 1 and 2 were configured in a return-to-zero switch capacitor amplification stage. The amplifiers were each stretched from one extreme of the output range to the opposite extreme.

The waveforms in (a) illustrate the asymmetrical behavior of the outputs of the amplifier in each of those circuits. If the pull-up and pull-down slew rates of the opamp are not exactly same, the outputs will swing with different slopes, causing the stronger slewing to last less. This will drive the loop of the corresponding booster with a stronger but shorter peak. The complimentary booster's node will instead be driven softer, but its transition will expire later. The nodes driven by the booster loops 25 are shown in (b).

In the circuit of FIG. 2, the two compensation capacitors are not connected to ground but to the same node, which is the bias node 13. Accordingly, the node reads the "average" or the common mode of these transitions, acting as a sensor of the strongest slewing and feeding back on the devices of the opposite side of the output. The reaction of node 13 to the stimulus coming from the asymmetry in the voltages read at the booster driven nodes 25 is depicted in (c).

In the case of the circuit of FIG. 1, if the pull-up is stronger than the pull-down, then the duration of the negative peak induced by the P-block booster loop (which is inverting, for negative feedback) is shorter; the longer positive peaking prevails on the base rail controlling the npns of the N-block, which hastens the critical phase: the slowest, i.e., the pull-down. This effect can be observed in the waveforms shown in FIGS. 6 and 7. Each of these FIGS. 6 and 7 shows the superior settling time provided by the circuit of FIG. 2, by illustrating the single-ended outputs OUTp and OUTn observed at maximum voltage signal, or about AVDD/2+2Vpp/4 (2.15V), and about AVDD/2−2Vpp/4 (1.15V). While there is a slight overshooting, the system delivers an appreciably faster settling with no slow-ramping tails and flat final voltage.

Figure 8:
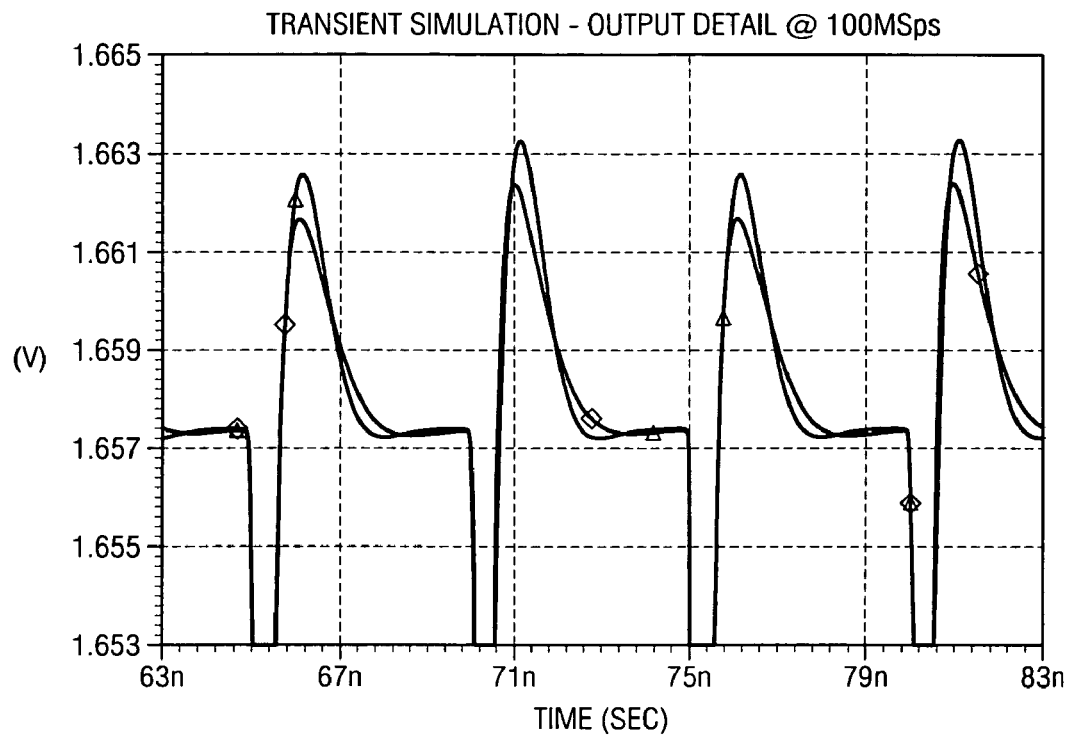
FIG. 8 shows waveforms representing the common mode output transients for the circuits in FIGS. 1 and 2.
Figure 9:
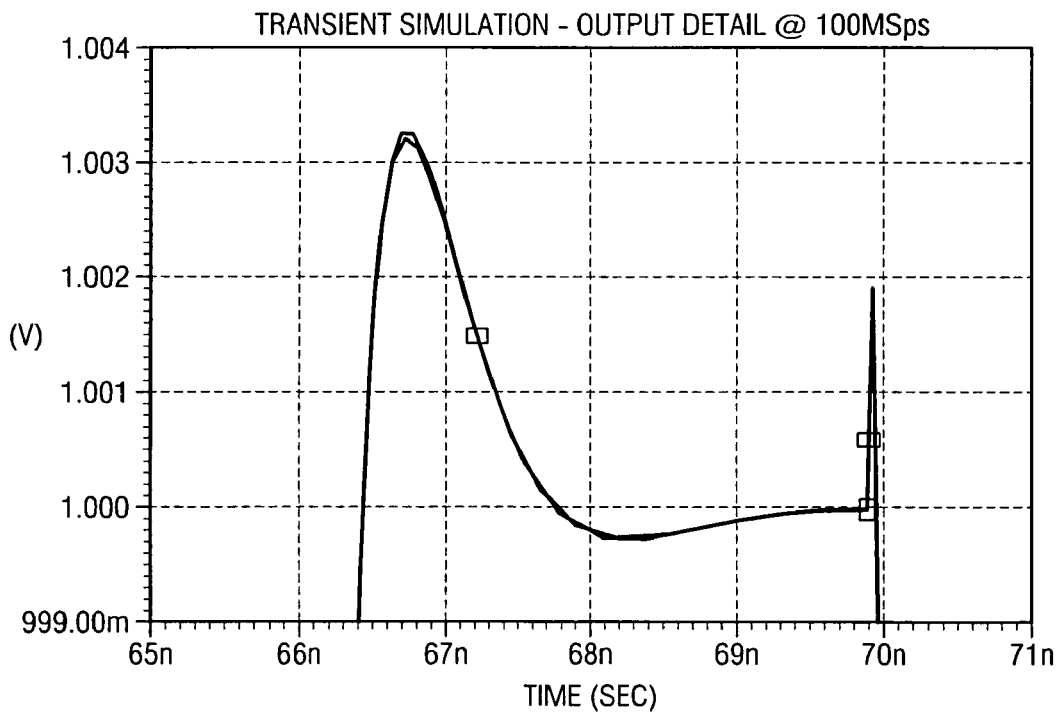
FIG. 9 shows the differential output transients for the circuits of FIGS. 1 and 2.

FIGS. 8 and 9 show the common mode and the differential output transients for the amplifier circuits of FIGS. 1 and 2. FIG. 8 reports the common mode, and reaffirms the better speed provided by the circuit of FIG. 2 compared to the more sluggish circuit shown in FIG. 1. A common mode disturbance will affect the differential path via conversions provided by any asymmetry in the circuit layout, or provided by temporarily unbalanced electrical transients. Accordingly, the settling advantage seen in FIG. 8 for the common mode will easily be reflected in the few differential microvolts constituting the LSB (least significant bit) (for example, in a 16 bit system 1LSB=16.5 uV, out of a one Vpp range).

FIG. 9 shows a similarity and closeness between the signals of each of FIGS. 1 and 2 even if the total amount of capacitance needed for the circuit of FIG. 2 is 50% less than in FIG. 1. The aforementioned common-mode to differential conversion mechanisms were turned off in the simulation, however their presence highlights a further advantage of the circuit in FIG. 2 over the one in FIG. 1. Experimental data will further reflect the advantage provided by the invention as implemented in FIG. 2, showing as much as 5 dB improvement in Spurious-Free Dynamic Range (SFDR) for an ADC incorporating the features of FIG. 2 against an identical ADC implemented with the opamp of FIG. 1.

It will also be appreciated by those of ordinary skill in the art that modifications to and variations of the above-described system and method may be made without departing from the inventive concepts disclosed herein. Accordingly, the invention should not be viewed as limited except as by the scope and spirit of the appended claims.

What is claimed is:

1. A circuit comprising:
  bias circuitry including a bias node, wherein the bias circuitry provides at the bias node a given DC bias voltage;
  a transconductance element to provide a given transconductance gain;
  a corresponding cascode element cooperative with the transconductance element, the corresponding cascode element having a connection to the bias node;
  a load for the transconductance element, the load being connected between an output having a given voltage level and a reference node having a reference voltage level, and the load comprising a gain booster element connected between a sense node and a driven node; and
  a capacitive element connected between the driven node within the load and the bias node.

2. The circuit according to claim 1, wherein the circuit comprises an amplification circuit.

3. The circuit according to claim 2, wherein the circuit comprises a multistage amplifier.

4. The circuit according to claim 2, wherein the circuit comprises a multistage wireless communications base station receiver.

5. The circuit according to claim 4, wherein the multistage wireless communications base station receiver, comprises a pipelined analog-to-digital converter.

6. The circuit according to claim 1, wherein the bias circuitry comprises a current source and a set of interconnected diode elements.

7. The circuit according to claim 6, wherein the diode elements comprise transistor elements.

8. The circuit according to claim 7, wherein the interconnected transistor elements of the bias circuitry comprise n-type and p-type transistor elements.

9. The circuit according to claim 1, wherein the transconductance element, the corresponding cascode element, the load, and the capacitive element comprise an output stage.

10. The circuit according to claim 1, wherein the transconductance element comprises one of a complementary differential pair of transconductance elements.

11. The circuit according to claim 10, wherein the differential pair of transconductance elements comprises transistors.

12. The circuit according to claim 11, wherein the transconductance transistors comprise n-type transistors.

13. The circuit according to claim 12, wherein the n-type transconductance transistors comprise npn bipolar junction transistors (BJTs).

14. The circuit according to claim 12, wherein the n-type transconductance transistors comprise NMOS FETs.

15. The circuit according to claim 11, wherein the transconductance transistors comprise p-type transistors.

16. The circuit according to claim 15, wherein the p-type transconductance transistors comprise pnp BJTs.

17. The circuit according to claim 15, wherein the p-type transconductance transistors comprise PMOS FETs.

18. The circuit according to claim 1, wherein the corresponding cascode element comprises a corresponding cascode transistor.

19. The circuit according to claim 10, wherein the corresponding cascode element comprises corresponding cascode elements respectively corresponding to the transconductance elements of the differential pair.

20. The circuit according to claim 1, wherein the corresponding cascode element comprises a transistor having a control input, a current input, and a current output, and wherein a DC cascode voltage from the DC bias voltage is maintained at the control input.

21. The circuit according to claim 20, wherein the DC bias voltage is equal to the DC cascode voltage.

22. The circuit according to claim 1, further comprising current source elements to provide a given current input current first through the corresponding cascode element and then through the transconductance element.

23. The circuit according to claim 22, wherein the current source elements comprise current source cascode elements.

24. The circuit according to claim 23, wherein the current source cascode elements comprise p-type transistors.

25. The circuit according to claim 24, wherein the p type current source cascode transistors comprise PMOS FETs.

26. The circuit according to claim 10, wherein the load comprises respective loads for the transconductance elements of the differential pair of the transconductance elements.

27. The circuit according to claim 1, wherein the load comprises an active load.

28. The circuit according to claim 27, wherein the active load comprises a gain booster.

29. The circuit according to claim 26, wherein the respective loads comprise respective single ended opamps.

30. The circuit according to claim 1, wherein the reference voltage level of the given reference node is lower than the given voltage level of the booster-driven node.

31. The circuit according to claim 1, wherein the capacitive element comprises a capacitor.

32. The circuit according to claim 31, wherein the booster-driven node is an active node of the load.

33. The circuit according to claim 32, wherein the booster-driven node within the load is a base or gate of the corresponding current source cascode element.

34. The circuit according to claim 1, wherein the load comprises a plurality of loads; each of the plurality of loads comprising a respective gain booster element connected between a respective sense node and a respective driven node, and a respective capacitive element connected between its corresponding driven node and the bias node.

* * * * *